United States Patent
Ray et al.

(10) Patent No.: US 10,497,672 B2
(45) Date of Patent: Dec. 3, 2019

(54) ULTRA-THIN DISPLAY USING PRINTED PRINTED LIGHT EMITTING DIODES

(71) Applicant: Nthdegree Technologies Worldwide Inc., Tempe, AZ (US)

(72) Inventors: William Johnstone Ray, Fountain Hills, AZ (US); Mark David Lowenthal, Gilbert, AZ (US); Richard Austin Blanchard, Los Altos, CA (US); Lixin Zheng, Kirkland, WA (US); Xiaorong Cai, Mount Pleasant, SC (US); Bradley S. Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 132 days.

(21) Appl. No.: 15/726,739

(22) Filed: Oct. 6, 2017

(65) Prior Publication Data

US 2018/0114775 A1    Apr. 26, 2018

Related U.S. Application Data

(60) Provisional application No. 62/412,203, filed on Oct. 24, 2016.

(51) Int. Cl.
*H01L 25/065* (2006.01)
*H01L 25/16* (2006.01)
(Continued)

(52) U.S. Cl.
CPC .......... *H01L 25/0655* (2013.01); *H01L 25/50* (2013.01); *H01L 27/15* (2013.01);
(Continued)

(58) Field of Classification Search
CPC . H01L 25/0655; H01L 25/59; H01L 25/0753; H01L 27/15; H01L 25/167;
(Continued)

(56) References Cited

U.S. PATENT DOCUMENTS 7,282,240 B1 * 10/2007 Jackman ................ B82Y 10/00
427/282
9,368,549 B1 * 6/2016 Oraw ..................... H01L 27/156
(Continued)

*Primary Examiner* — Kwang-Su Yang
(74) *Attorney, Agent, or Firm* — Patent Law Group LLP; Brian D. Ogonowsky

(57) ABSTRACT

Active LEDs have a control transistor in series with an LED and have a top electrode, a bottom electrode, and a control electrode. The active LEDs are microscopic and dispersed in an ink. A substrate has column lines, and the active LEDs are printed at various pixel locations so the bottom electrodes contact the column lines. A hydrophobic mask defines the pixel locations. Due to the printing process, there are different numbers of active LEDs in the various pixel locations. Row lines and control lines contact the top and control electrodes so that the active LEDs in each single pixel location are connected in parallel. If the LEDs emit blue light, red and green phosphors are printed over various pixel locations to create an ultra-thin color display. Any active LED may be addressed using row and column addressing, and the brightness may be controlled using the control lines.

20 Claims, 9 Drawing Sheets

(51) Int. Cl.
   *H01L 33/62* (2010.01)
   *H01L 25/00* (2006.01)
   *G09G 3/32* (2016.01)
   *H01L 27/15* (2006.01)
   *H01L 33/50* (2010.01)

(52) U.S. Cl.
   CPC ....... *G09G 3/32* (2013.01); *G09G 2320/0626* (2013.01); *H01L 25/167* (2013.01); *H01L 33/505* (2013.01); *H01L 33/62* (2013.01); *H01L 2933/0033* (2013.01); *H01L 2933/0066* (2013.01)

(58) Field of Classification Search
   CPC ............. H01L 33/62; H01L 2933/0066; H01L 33/505; H01L 2933/0033; G09G 2320/0626; G09G 3/32
   See application file for complete search history.

(56) References Cited

U.S. PATENT DOCUMENTS

2015/0228631 A1* 8/2015 Ray .................... H01L 25/0753
                                                          257/88
2016/0293586 A1* 10/2016 Ghosh .................. H01L 25/167

* cited by examiner

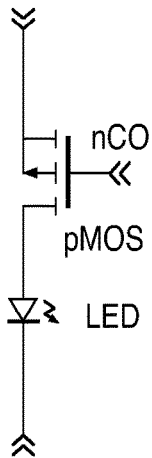 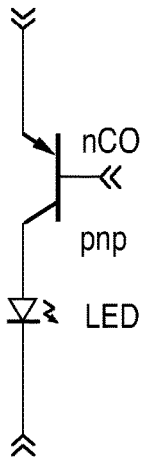 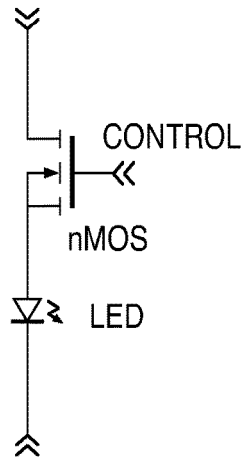 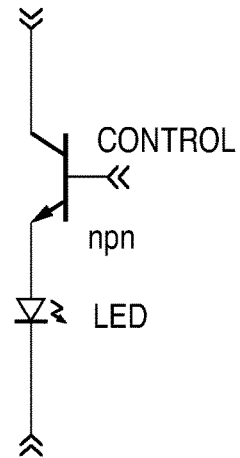
FIG. 8   FIG. 9   FIG. 10   FIG. 11
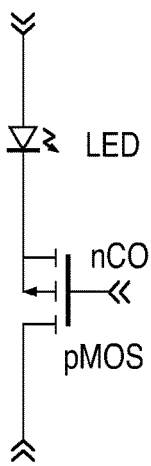 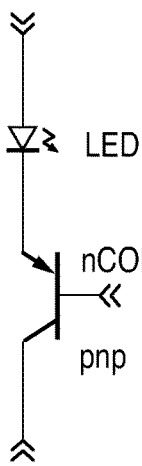 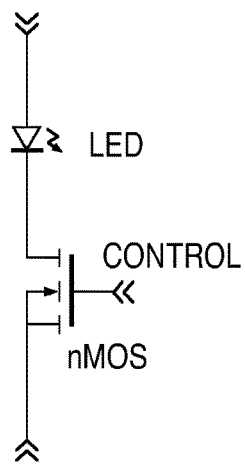 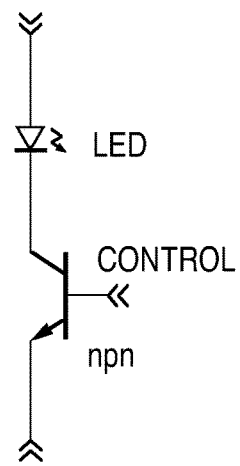
FIG. 12   FIG. 13   FIG. 14   FIG. 15

FIG. 26B nCONTROL DOWN SHORTED TO nCONTROL UP

FIG. 27B nCONTROL DOWN FLOATING

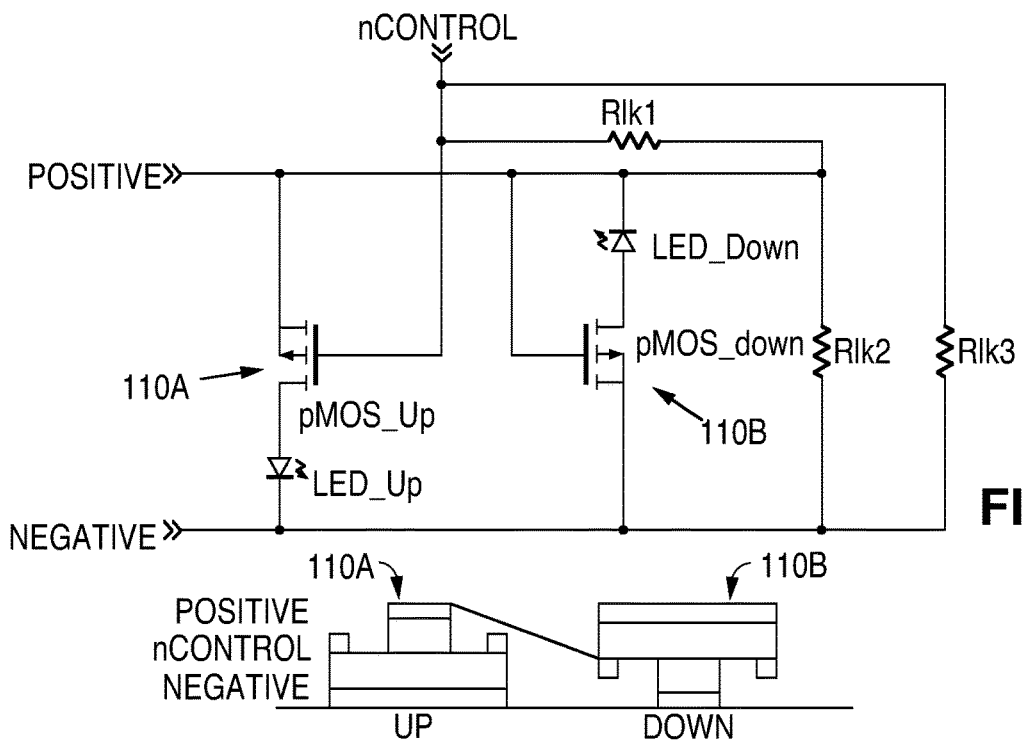
FIG. 28A
FIG. 28B
nCONTROL DOWN
SHORTED TO POSITIVE
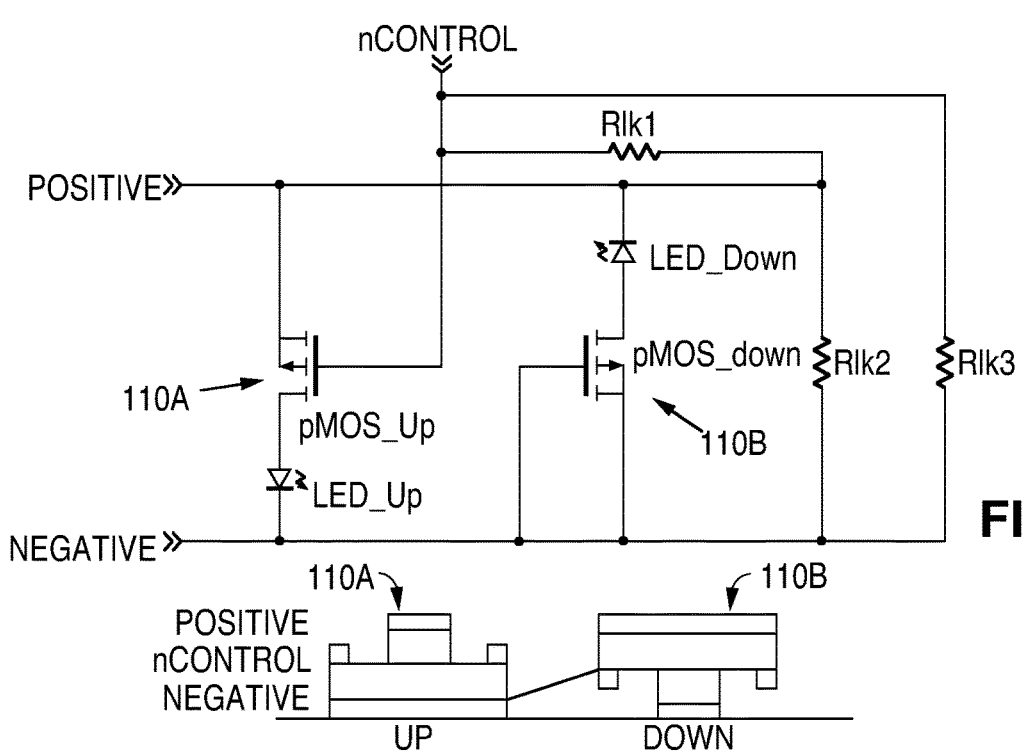
FIG. 29A
FIG. 29B
nCONTROL DOWN
SHORTED TO NEGATIVE

ULTRA-THIN DISPLAY USING PRINTED PRINTED LIGHT EMITTING DIODES

CROSS-REFERENCE TO RELATED APPLICATIONS

This application claims priority from U.S. provisional application Ser. No. 62/412,203, filed Oct. 24, 2016, by William J. Ray et al., assigned to the present assignee and incorporated herein by reference.

FIELD OF THE INVENTION

This invention relates to an addressable display using light emitting diodes (LEDs) and, in particular, to an addressable array of printed active LEDs, where each active LED includes a driver transistor.

BACKGROUND

Active displays using packaged inorganic LEDs as blue, red, and green pixels are well known and are commonly used for large displays due to the relatively large pixels composed of standard size packaged LEDs. A conventional LED die is about 0.1-1 $mm^2$, and a packaged LED is typically a few millimeters in diameter and includes a lens for improving light extraction. Such displays are relatively thick and rigid since they use printed circuit boards. Using such a design for a small display is not particularly useful due to the low pixel density, the thickness, and the relatively high expense.

Organic LED (OLED) displays can be made very flat with a high pixel density, but such OLEDs generally have poor reliability and a short lifetime.

What is needed is a display that uses long-life inorganic LEDs, where the display may be made very thin and inexpensively, and where the pixels may have a high density.

SUMMARY

In one embodiment, an LED and a driver transistor are integrated into a microscopic printable device, referred to herein as an active LED, having a top electrode, a bottom electrode, and an intermediate control electrode. Each active LED has the LED portion in series with a vertical driver transistor so that the top electrode and bottom electrode of the active LED carry the LED current. The control electrode is used to control a brightness of the LED or just turn on the LED.

An ink containing such active LEDs is printed over column conductor lines or a conductive backplane on a substrate to electrically contact the bottom electrode of each active LED. In one embodiment, the substrate is covered with a hydrophobic mask that precisely defines where the ink will be located. Using the hydrophobic mask to define the pixel locations is more accurate than selectively printing the LEDs, since the resolution is higher and there is no spreading of the ink. The mask forms rows and columns of pixel wells over the substrate, and the pixel wells form a high density pixel array. Since the active LEDs are uniformly dispersed in the ink, the number of active LEDs residing in each pixel well will be random but within a controlled range, such as from 3-5. However, statistically, the number of active LEDs in each unit area incorporating a number of pixels will be generally the same. A uniform current through all the pixels will substantially produce the same brightness per pixel even though the number of LEDs in each pixel varies.

Transparent and/or non-transparent row conductor lines and control lines are also formed over the substrate, and aligned with the mask, to electrically contact the top electrodes and control electrodes of the active LEDs.

In one embodiment, the bottom electrodes of all the printed active LEDs contact a ground plane, the X-axis (row) printed conductor lines are connected to the control electrodes of the active LEDs in each row, and the Y-axis (column) conductor lines are connected to the top electrodes of the active LEDs in each column. In another embodiment, the row and column lines are connected to different electrodes of the active LEDs. Any conductors between the active LEDs and the light emitting surface of the display are transparent conductors, such as ITO or sintered silver nanowires.

Any active LED in the array can thus be addressed and energized by simultaneously energizing a row line and a column line. The brightness of any pixel may be controlled by the magnitude of the voltage applied to the control electrode (e.g., across the gate/source of a MOSFET or the base/emitter of a bipolar transistor).

In one embodiment, all the printed LEDs are GaN-based and emit blue light. Different phosphors are printed over some of the pixel wells to convert the blue light to red light and green light, so there are groups of red, green, and blue sub-pixels that can be controlled to create any color in a super-pixel composed of a contiguous group of red, green and blue sub-pixels.

Since the substrate can be a thin flexible film, and each layer may only be a few microns thick, the resulting display is very thin (e.g., less than 100 microns or 4 mils) and flexible. The display may be very large with high reliability, since multiple active LEDs in each pixel well are connected in parallel and failure of a single LED in a pixel will not affect the brightness of the pixel. Since the entire display is formed using printing, such as screen printing, inkjet printing, or flexography, the display may be formed very inexpensively.

The active LEDs may have a shape that causes them to be oriented properly relative to the substrate. If any active LEDs in a pixel well are not oriented properly, such as upside down or sideways, the LEDs will not conduct so will act as an open circuit.

Various other embodiments are described.

BRIEF DESCRIPTION OF DRAWINGS

FIG. 8 illustrates a PMOS driver transistor connected to the anode of an LED.

FIG. 9 illustrates a pnp bipolar driver transistor connected to the anode of an LED.

FIG. 10 illustrates an NMOS driver transistor connected to the anode of an LED.

FIG. 11 illustrates an npn bipolar driver transistor connected to the anode of an LED.

FIG. 12 illustrates a PMOS driver transistor connected to the cathode of an LED.

FIG. 13 illustrates a pnp bipolar driver transistor connected to the cathode of an LED.

FIG. 14 illustrates an NMOS driver transistor connected to the cathode of an LED.

FIG. 15 illustrates an npn bipolar driver transistor connected to the cathode of an LED.

FIG. 20 also illustrates a transparent row line contacting the control electrodes of the active LEDs in the row.

FIG. 23 is a cross-sectional view of a portion of a substrate with a hydrophobic mask and a conductive ink printed over the mask and cured to form column lines.

FIG. 24 illustrates another hydrophobic mask forming pixel wells for the active LED layer, where the wells are slightly wider than the column line mask openings.

FIG. 25 illustrates the active LEDs printed over the mask, with the one or more active LEDs within each pixel well being electrically connected to the associated column line. Dielectric layers and conductors for the control and positive electrodes are also shown, along with different phosphors printed over each pixel well to form red, green, and blue pixels.

FIG. 26B illustrates the shorting of the control terminals of the active LEDs of FIG. 26A.

FIG. 27B illustrates the active LEDs of FIG. 27A.

FIG. 28A schematically illustrates the circuit created by two active LEDs in a single pixel well having reverse orientations, where the middle control terminal of one active LED is shorted to the positive terminal of the other active LED.

FIG. 28B illustrates the active LEDs of FIG. 28A.

FIG. 29A schematically illustrates the circuit created by two active LEDs in a single pixel well having reverse orientations, where the middle control terminal of one active LED is shorted to the negative terminal of the other active LED.

FIG. 29B illustrates the active LEDs of FIG. 29A.

Elements that are the same or similar in the figures are labeled with the same numeral.

DETAILED DESCRIPTION

Figure 1:
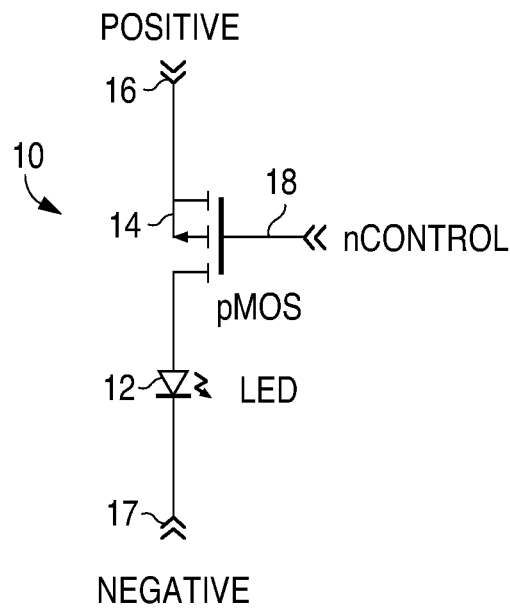
FIG. 1 is a schematic of a single active LED in accordance with one embodiment of the invention.

FIG. 1 illustrates the circuitry in a 3-terminal active LED 10. The active LED 10 is formed as a single die, singulated from a wafer. The active LED 10 contains an LED 12 and a driver transistor 14. In the particular example of FIG. 1, the driver transistor 14 is a PMOS transistor with its source and drain in series with the LED 12 to control the current through the LED 12. The drain-source impedance adds to the impedance of the LED 12. Therefore, the total series impedance can be control by modulating the gate of the transistor 14. In this manner the transistor 14 performs a variable resistance or switching behavior. As such, forward current can only flow if the gate is biased beyond the PMOS transistor turn-on threshold. The active LED 10 has three electrodes 16, 17, and 18.

Other configurations of a single transistor, active LED are possible, as described later. The selection of a particular configuration of the LED and transistor and the particular type of transistor depends on the control requirements or constraints of the application.

Figure 2:
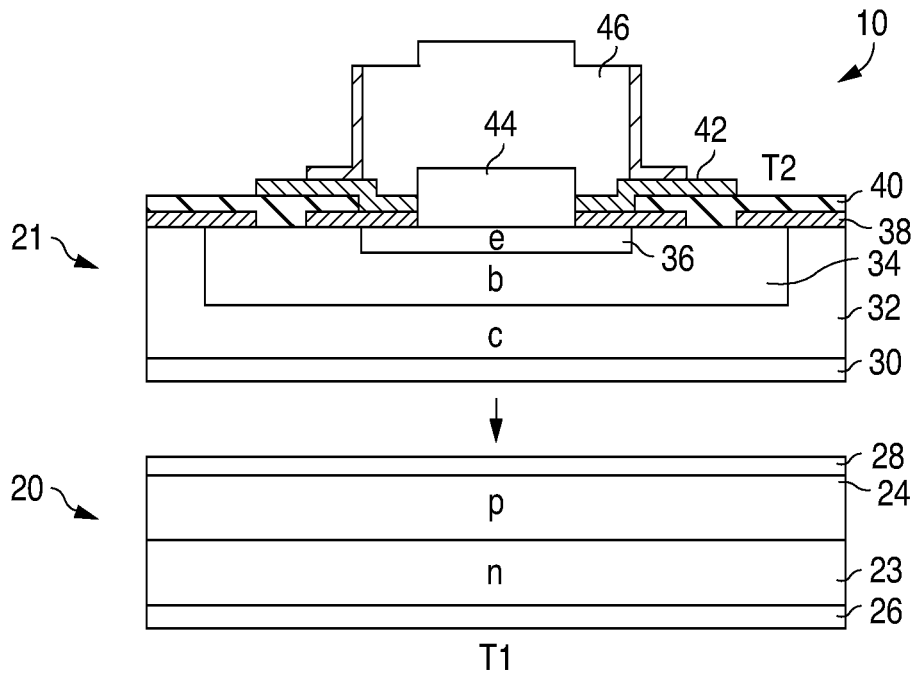
FIG. 2 is a cross-sectional view of a small portion of an LED wafer being bonded to a driver transistor wafer to form an active LED after singulation.

FIG. 2 illustrates one embodiment of the structure of the active LED 10, where the driver transistor 14 is a pnp bipolar transistor rather than a MOSFET. FIG. 2 illustrates small portions of two wafers 20 and 21, which may be formed using different materials and technologies.

Wafer 20 is an LED wafer containing thousands of vertical LEDs. For blue light, the material system may be AlInGaN, where the stoichiometry determines the peak emission wavelength. Forming such LEDs is well known. The blue LED may be eventually covered with a phosphor to produce any color. The LED wafer 20 may instead use other material systems to achieve a wide range of peak wavelengths from green to red. The LEDs may include a multi-well active layer, as is well known. The wafer 20 is shown very simplistically since forming LEDs is conventional. Basically, an n-type epitaxial layer 23 and a p-type epitaxial layer 24 are grown over a growth substrate (e.g., sapphire, SiC, or GaAs). Light is generated at the pn interface. An active layer may be formed at the interface. The growth substrate should be removed if highly resistive or light absorbing. The n-type epitaxial layer 23 may also be thinned.

In one embodiment, the bottom surface of the LED wafer 20 is coated with a transparent conductor layer, such as a thin gold layer, to make ohmic contact to the layer 23 and spread current. Metal electrodes may be formed as thin fingers, asterisk-shaped, or otherwise take up a small area so as not to block a significant amount of light in the downward direction. In another embodiment, the bottom surface of the LED wafer 20 is coated with a reflector layer so that light is only emitted from the sides or top of each singulated LED. The bottom layer 26 in FIG. 2 represents any form of bottom conductor, including those described above. In the example, the bottom conductor is a cathode conductor, but in some embodiments, the bottom conductor is an anode conductor.

The top surface of the LED wafer 20 is prepared for being bonded to the bottom surface of the wafer 21 to form a substantially ohmic contact. In one embodiment, the top surface of wafer 20 is a very flat reflective metal layer 28 that is bonded to a similar metal layer 30 on wafer 21 by pressure and heat. In another embodiment, the joining surfaces of the wafers 20 and 21 may be by a process performed by Ziptronix, Inc., such as described in U.S. Pat. No. 7,842,540, incorporated herein by reference. The LED wafer 20 may have any diameter, such as 3-8 inches. A suitable voltage applied between the top and bottom surfaces of the LED wafer 20 will cause the LEDs to emit light.

The top wafer 21 forms vertical pnp transistors associated with each LED portion in the LED wafer 20. There will typically be thousands of LEDs and pnp transistors formed in a wafer. The wafer 21 may use a p-type silicon substrate, acting as a collector 32, in which is formed, by conventional photolithographic techniques, an n-type base 34 and a p-type emitter 36. Each collector 32 may have a square shape coinciding with the singulation edges of the modules.

The various dielectric layers and metal electrodes over the wafer 21 may be formed by printing or by using conventional vacuum chamber techniques. If printing is used, such as screen printing, a dielectric layer 38 is formed with openings over the base 34 and emitter 36. A first metal layer 40 is then printed, using a screen for masking, in the openings to contact the base 34 and emitter 36. The first metal layer 40 may be an ink containing metal (e.g., Ni, Ti, Al, etc.) particles and a solvent. When the ink is cured, the solvent evaporates and the metal particles are sintered together. Another dielectric layer 42 is printed with openings over the emitter 36 metal and base 34 metal. An additional metal layer 44, such as aluminum, is printed over the emitter 36 metal, followed by a thick emitter electrode layer 46. The metal layers may include a barrier layer. The emitter and base terminals may be designed differently depending on the application and packaging.

The various dielectric and metal layers over the wafer 21 may be formed after the wafers 20 and 21 are ohmically bonded together to avoid damage to the conductors.

The bonded wafers 20 and 21 are then singulated using conventional techniques such as etching, sawing, scribing-and-breaking, laser, etc. In one embodiment, the active LEDs 10 have a diameter less than 50 microns and a height less than 30 microns so that they may be uniformly dispersed in an ink for printing. The number of printed active LEDs 10 per unit area may be freely adjusted when printing the active LEDs 10 on a substrate.

Printable LEDs may be formed with a light-emitting surface area range of between 50-5000 um$^2$. For very small LED sizes, etching is the preferred method for singulation.

Figure 3:
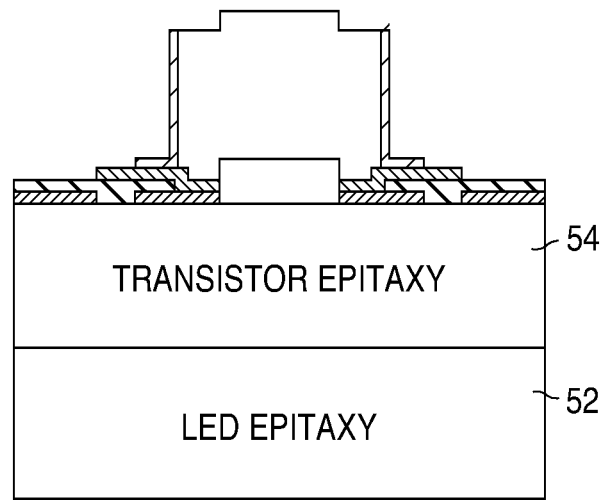
FIG. 3 is a cross-sectional view of an active LED, where the LED and driver transistor have been formed in the same substrate.

FIG. 3 illustrates an example where a growth substrate (not shown) has grown over it the LED layers 52, followed by the transistor layers 54, to form an active LED 56. The transistor may be a FET or a bipolar transistor. The dielectric and metal layers over the top surface of the active LED 56 may be similar to those layers in FIG. 2. If the growth substrate is conductive, such as SiC, it may be left on the active LED. Light may exit either the top surface, the bottom surface, or the side surface, depending on the materials and the application.

FIG. 3 may also illustrate an example where the transistor layers 54 are first grown on a substrate wafer, and the LED layers 52 are then grown over the transistor layers 54. The transistor layers 54 thus act as the growth substrate for the LED layers 52. In one embodiment, the growth substrate may be a conventional substrate for growing GaN layers, such as sapphire, SiC, GaN, silicon, etc. The transistor layers 54 may be one or more GaN layers for a FET. The LED layers 52 are then grown to create a conventional GaN-based heterojunction LED that emits blue light. The growth substrate is then removed, such as by using laser lift off or grinding to expose the transistor layers 54. The transistor layers 54 may then be thinned. In one embodiment, the transistor layers 54 are n-type GaN layers, and, after the substrate is removed, the n-type surface of the transistor layers 54 is then subjected to conventional photolithographic masking and doping processes (e.g., by diffusion or implantation) to form a p-type gate region and an n-type source region. The dielectric and metal layers may then be printed to create a transistor.

In another embodiment represented by FIG. 3, the transistor is a heterojunction type and the layers 54 may be grown as a p-type collector layer, an n-type base layer, and a p-type emitter layer. Opposite conductivities may be used. The LED layers 52 are then grown over the top layer of the transistor layers 54. After the growth substrate is removed, the semiconductor layers may be etched and metal layers deposited to electrically contact the various layers in the transistor. The dielectric and metal layers, similar to those shown in FIG. 2, may then be printed to complete the bipolar transistor structure. Other types of transistors may be formed integral with the LED layers 52. Forming GaN-based transistors is conventional.

The structures of FIGS. 2 and 3 are described in US publication 2013/0221368, assigned to the present assignee and incorporated herein by reference.

The resulting wafer is then singulated to form many thousands of individual active LEDs 56 for printing at a low cost.

By growing the LED layers 52 and transistor layers 54 to form an integral structure, any voltage drop across a bonded barrier (like in FIG. 2) is avoided and efficiency is improved. Fabrication cost is also much less compared to the bonded structure of FIG. 2.

Figure 4:
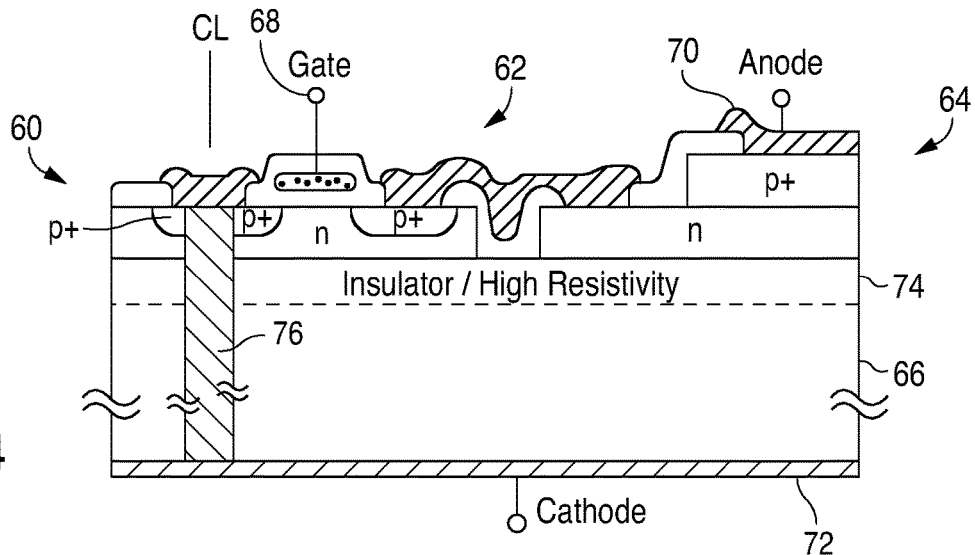
FIG. 4 is a cross-sectional view of an LED and a vertical MOSFET formed in the same substrate.

FIG. 4 illustrates a portion of the internal structure of a single active LED 60 having a center transistor portion 62 and an outer LED portion 64 formed over the top surface of the substrate 66. The structure may be symmetrical about the center line CL so all portions of the LED surrounding the transistor are driven with an equal current. The active LEDs 60 may be hexagonal or rectangular (including a square).

The active LED 60 has a gate electrode 68, an LED anode electrode 70, and a transistor cathode or drain electrode 72. The LED portion 64 and transistor portion 62 are grown over an insulating layer 74, which may be an undoped or counter-doped semiconductor portion. If the substrate 66 is not sufficiently conductive to conduct the vertical current, a through via 76 may be laser-drilled or etched and then filled with a conductive material. The walls of the via 76 may be first coated with a thin dielectric layer if needed. A wrap-around conductor may be used instead of a via to conduct the vertical current.

In one embodiment, the substrate 66 is Si, GaN, SiC, GaAs or other suitable material. If a sapphire substrate is used as the growth substrate, for growing GaN layers, the sapphire may be removed by laser lift-off or grinding. Therefore, the substrate 66 will be the remaining GaN layers. If a silicon growth substrate is used, intermediate buffer layers are epitaxially grown over the silicon surface to provide lattice matching to the ultimate GaN layers in which the blue or green LED is formed. For red LEDs, the substrate 66 may be GaAs.

Figure 5:
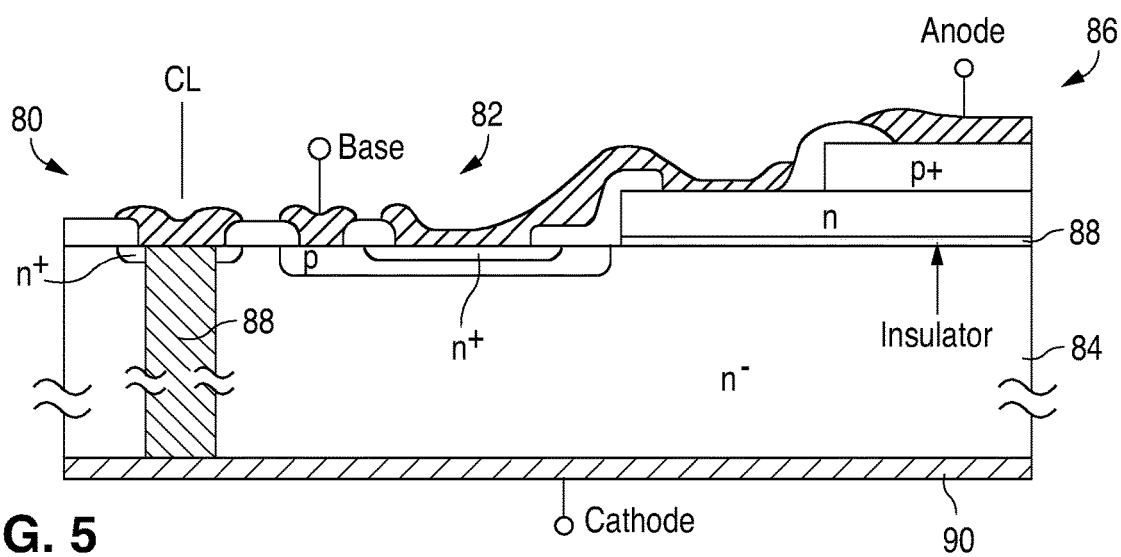
FIG. 5 is a cross-sectional view of an LED and a vertical bipolar transistor formed in the same substrate.

FIG. 5 illustrates another printable active LED 80, where a bipolar transistor 82 is formed in a substrate 84, such as a silicon substrate, and an LED portion 86 is epitaxially grown over an insulating layer. A conductive via 88 may be used to electrically couple the collector to the bottom electrode 90.

The structures of FIGS. 4 and 5 are described in US publication 2014/0191249, assigned to the present assignee and incorporated herein by reference.

Figure 6:
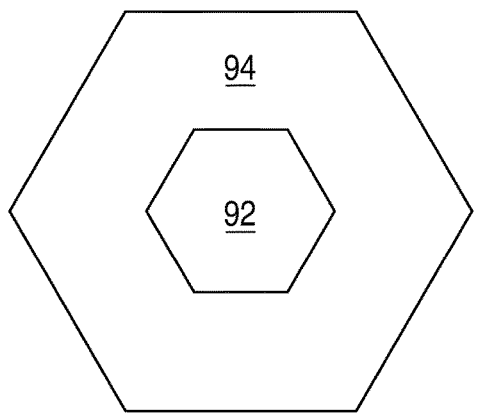
FIG. 6 is a top down view of a hexagonal embodiment of an active LED, with the LED portion surrounding a central transistor portion.
Figure 7:
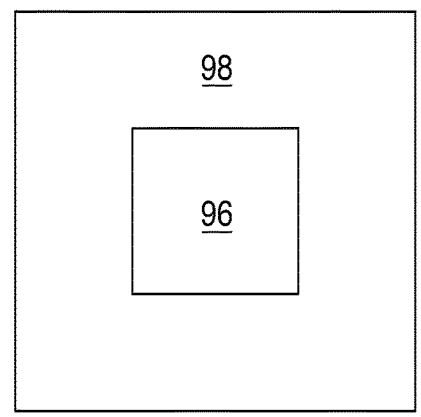
FIG. 7 is a top down view of a square embodiment of an active LED, with the LED portion surrounding a central transistor portion.

FIG. 6 is a top down view of a printable hexagonal active LED shape where the transistor 92 is surrounded by the LED 94. FIG. 7 is a top down view of a square active LED shape where the transistor 96 is surrounded by the LED 98.

In all embodiments of an active LED, the light may exit from the substrate side, the opposite side, the lateral sides, or a combination of the sides of the active LED.

In an active LED, the control transistor may be connected as a high side transistor or a low side transistor, and the transistor may be a MOSFET, a bipolar transistor, or any of the other types of transistors mentioned herein. All of the transistor types are formed as vertical transistors. FIGS. 8-15 illustrate some of the possible configurations. Forming all of the vertical transistor types is well-known.

FIG. 8 is identical to FIG. 1.

FIG. 9 uses a high side pnp bipolar transistor as the control transistor.

FIG. 10 uses a high side n-channel MOSFET as the control transistor.

FIG. 11 uses a high side npn bipolar transistor as the control transistor.

FIG. 12 uses a low side p-channel MOSFET as the control transistor.

FIG. 13 uses a low side pnp bipolar transistor as the control transistor.

FIG. 14 uses a low side n-channel MOSFET as the control transistor.

FIG. 15 uses a low side npn bipolar transistor as the control transistor.

The transistors may be controlled by varying the gate, base, source, or emitter voltage. The active LEDs may be turned on or off by controlling the voltage applied to any one or a combination of the three electrodes.

The microscopic active LEDs of any of the embodiments are then dispersed in a solvent to form an ink. Forming an ink containing 2-terminal LEDs and printing the ink on a substrate is described in U.S. Pat. No. 8,723,408, assigned to the present assignee and incorporated herein by reference.

FIGS. 16-25 illustrate ways to print the microscopic active LEDs of any of the above-described embodiments to form a color display, even though the active LEDs are printed in a non-deterministic manner.

Figure 16:
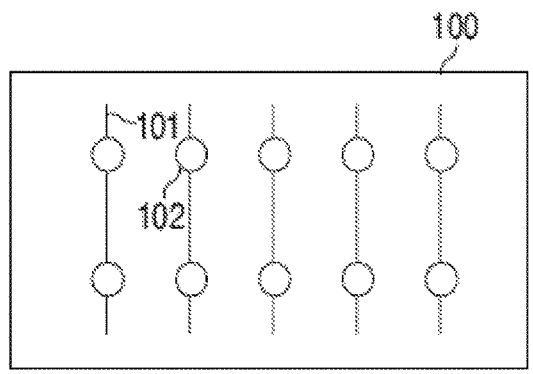
FIG. 16 is a top down view of a small portion of a substrate with conductive column lines and pixel pads printed. In another embodiment, the conductor/pad may be a continuous ground plane.

FIG. 16 is a top down view of a very small portion of a display substrate 100. The substrate 100 may be opaque or transparent, depending on the intended light exit side of the display. The substrate 100 may be a thin, flexible, polymer film, such as polycarbonate, PET (polyester), PMMA, Mylar or other type of polymer sheet, or even a thin metal film. In one embodiment, the substrate 10 is about 25-50 microns thick.

Thin column conductors 101 (or lines) and pixel pads 102 are then printed using, for example, screen printing or inkjet printing. The conductors 101 and pixel pads 102 may be formed of sintered metal particles, such as aluminum, after the conductor ink is cured. Alternatively, a hydrophobic mask may be used, in conjunction with the printing, to define the conductors 101 and pixel pads 102. The pitch of the pixel pads 102 may be the minimum possible with the tolerances of the printing process, such as 100 microns or less.

Figure 17:
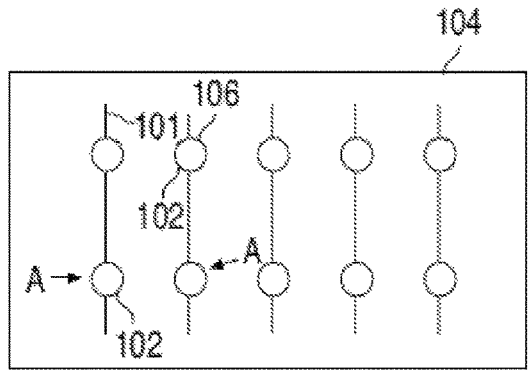
FIG. 17 illustrates a hydrophobic mask printed over the substrate having openings defining pixel wells where one or more active LEDs will be printed within each pixel well.

In FIG. 17, a hydrophobic mask 104 is then printed over the substrate 100, such as by screen printing, flexography, etc., and aligned with the column conductors 101 and pixel pads 102. Photolithography or laser etch may also be used to define the hydrophobic mask 104. The mask material is conventional and commercially available. One possible mask material may be a polymer. The optimal mask material depends on the particular type of ink solvent used in the active LED ink. Many different types of commercially available solvents can be used, such as alcohol. The mask 104 forms an array of pixel wells 106, which may be as small as 50 microns in diameter, sufficient to allow at least one active LED to be printed in a pixel well 106. Each pixel well 106 surrounds a metal pixel pad 102. Some mask materials can form walls with a lateral thickness between openings of 10 microns.

The mask 104 may form circular holes or may form a mesh.

Figure 18:
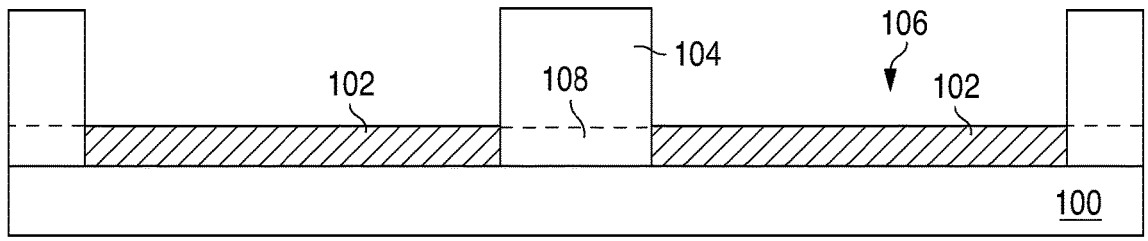
FIG. 18 is a cross-sectional view of only two pixel wells containing column lines.

FIG. 18 is a cross-sectional view of two pixel wells 106 along line A-A in FIG. 17. The mask 104 may overlap the conductors 101 and pixel pads 102 somewhat. Also shown is an optional separate mask portion 108 that may be used to define the location of the conductors 101 and pixel pads 102.

If light is to exit through the substrate 100 surface, the conductors 101 and pixel pads 102 would be transparent, such as ITO or sintered silver nano-wires. The conductors 101 and pixel pads 102 may be reflective if light is to only exit the opposite surface of the display.

Figure 19:
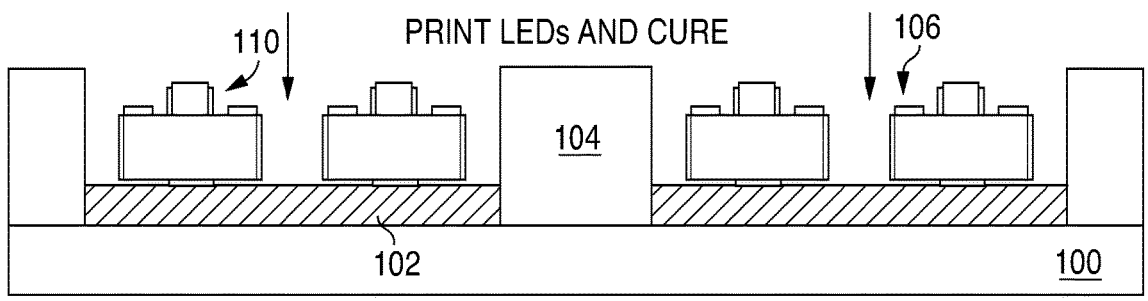
FIG. 19 illustrates a plurality of active LEDs being printed in the pixel wells, where the bottom electrode of the active LEDs electrically contacts the column line after the ink is cured.

In FIG. 19, the active LED ink is printed and de-wets or repels off the mask 104 by capillary action to fill the pixel wells 106. The orientation of the printed active LEDs 110 may be controlled by the shape of the active LEDs 110, such as with an extended top electrode. The light may exit any surface of the active LEDs 110.

After printing, the ink is cured by heating to evaporate the solvent and electrically connect the bottom electrodes of the active LEDs 110 to the pixel pads 102. Although only two active LEDs 110 are shown in each pixel well 106, there may be any number of active LEDs 110 in a pixel well 106. Since the active LEDs 110 are uniformly dispersed in the ink, there will be a narrow range of active LEDs 110 in each pixel well 106, such as 3-5.

Figure 20:
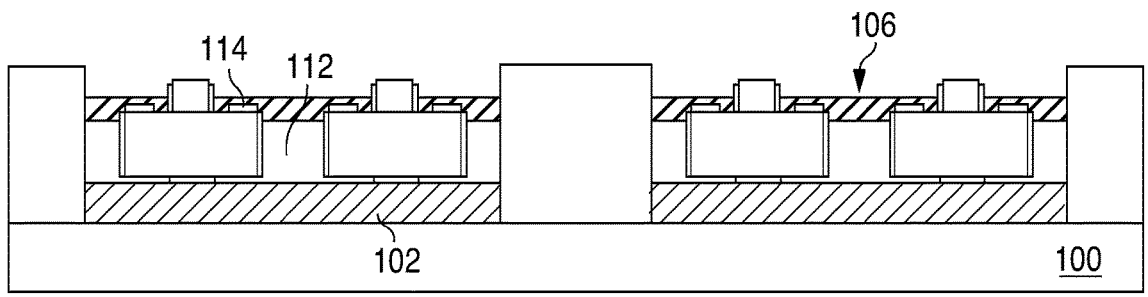
FIG. 20 illustrates a dielectric layer over the column line and encapsulating the sides of the active LEDs.

In FIG. 20, a transparent or translucent dielectric layer 112 is printed in the pixel wells 106 and de-wets or pulls back off the tops of the active LEDs 110 by capillary action. If any dielectric remains over the top electrodes, a blanket etch step may be performed to expose the top electrodes.

Next, a control terminal conductor layer 114 is printed to contact the control electrodes on the active LEDs 110. The conductor layer 114 may form row lines for addressing the active LEDs 110, or may be a blanket deposition if the addressing of the active LEDs 110 is to be done by controlling voltages to the top and bottom electrodes of the active LEDs. If the conductor layer 114 is a blanket deposition, the conductor layer 114 may then be used for overall brightness control. The conductor layer 114 will be transparent, if needed, to allow light to pass through.

Figure 21:
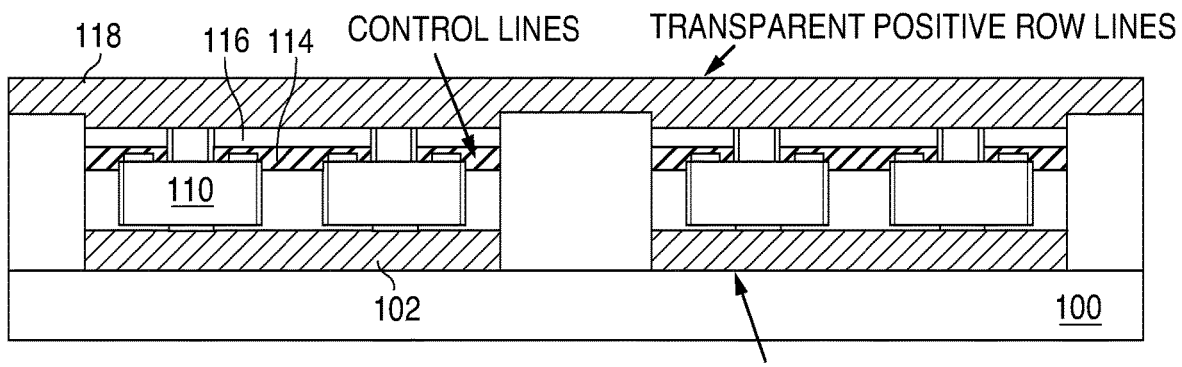
FIG. 21 illustrates another dielectric layer over the row lines, followed by forming a transparent top conductor layer or conductor lines electrically contacting the top electrode of the active LEDs. The top conductor may also form additional row or column lines. In this embodiment, light exits through the top of the structure. In another embodiment, the light exits through the transparent substrate, depending on the particular construction and orientations of the active LEDs.

In FIG. 21, another dielectric layer 116 is printed over the conductor layer 114, followed by a top conductor layer 118 for electrically contacting the top electrodes of the active LEDs 110. The conductor layer 118 may be printed as row lines. Screen printing, inkjet printing, or printing using a hydrophobic mask may be used to define the row lines. The conductor layer 118 will be transparent, if needed, to allow light to pass through. All the active LEDs 110 in a single pixel well 106 are thus connected in parallel.

Figure 22:
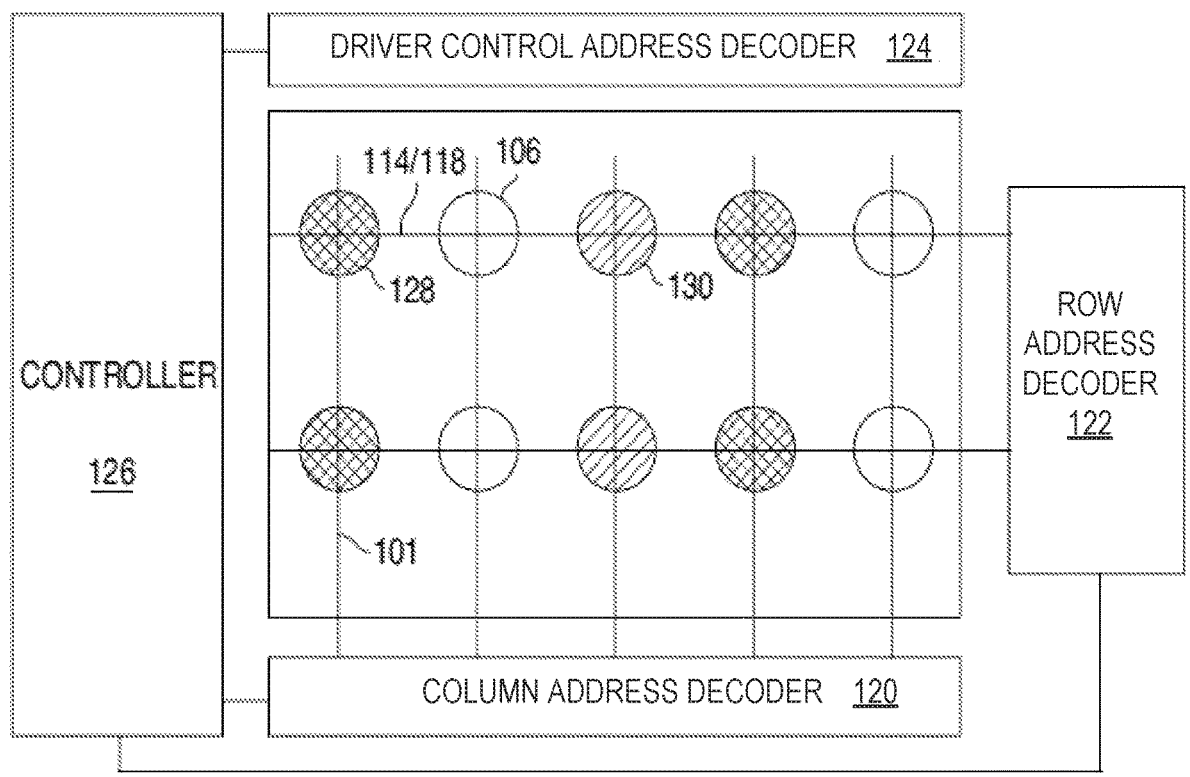
FIG. 22 is a top down view of the resulting simplified display, where different phosphors have been printed over selected pixel wells to create individually-controllable red, green, and blue pixels, where the active LEDs in each pixel well are addressed using row and column address decoders.

FIG. 22 illustrates the structure of FIG. 21, where the column conductors 101 are selectively energized with a column address decoder 120 and where the row conductors (which may be conductor layer 114 or 118) are energized with a row address decoder 122. The control electrode conductor layer 114 may be connected to a driver control address decoder 124 if individual brightness control is desired or if the active LEDs 110 are to be addressed using their transistor control electrodes. The drive control address decoder 124 may generate an analog signal to control the brightness of the addressed pixel, or a PWM control signal may be generated to control the brightness. A controller 126 may scan the array at a high speed for a dynamic display of any image or animation. Any pixel location in the array may be addressed by a combination of voltages simultaneously applied to a row line and a column line, which applies voltages to two of the three electrodes of the active LEDs 110 in a pixel well, while the remaining electrode of the active LEDs in the pixel well is connected to another voltage, resulting in the addressed LEDs being forward biased.

Providing each active LED 110 with its own controllable driver enables each LED to be controlled to output a desired brightness despite process variations, changes in brightness with temperature, and changes in brightness with age.

In one embodiment, all the active LEDs 110 emit blue light and are identical. For a full color display, some pixel wells 106 have a red phosphor 128 printed over them, some pixel wells 106 have a green phosphor 130 printed over them, and some pixel wells 106 have no phosphor printed over them. Therefore, contiguous red, green, and blue sub-pixels may form a super-pixel of any color by controlling the relative brightness of the sub-pixels per image frame. Different screens, having different mask patterns, may be used to print the phosphors. Quantum dots or other wavelength conversion materials may also be used.

The color display of FIG. 22 may be made very large with a high probability that all the pixels will have at least one active LED 110 in it. The display is very light, thin, flexible, and inexpensive since all layers are printed. In one embodiment, the pixel array portion of the display is less than 500 microns thick and as thin as 100 microns. The light may exit from the top or bottom (substrate side) depending on the structure of the active LEDs. The phosphors are printed on the light exit side.

Figure 23:
FIGS. 23-25 illustrate an alternative depiction of forming the color display, where a high density of pixels may be formed.
Figure 24:
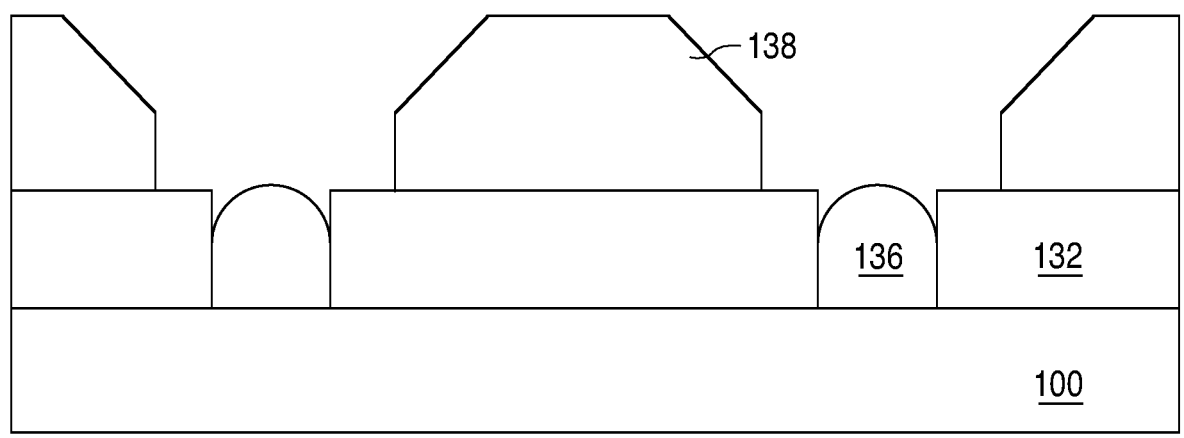
Figure 25:
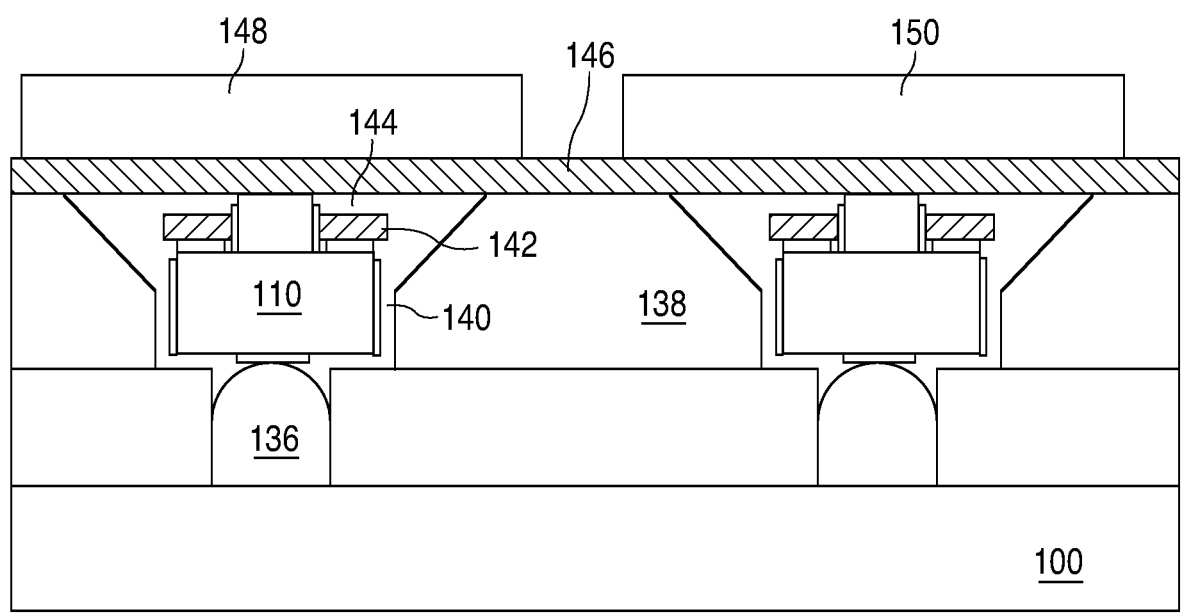

FIGS. 23-25 illustrate an alternative printing method for forming the display of FIG. 22.

In FIG. 23, a hydrophobic mask 132 is printed on the substrate 100 to define narrow column conductor areas 134. An ink containing conductive particles is then printed over the mask 132. The ink will de-wet from the mask 132 and pool in the mask openings. The ink is then cured to form the column conductors 136.

In FIG. 24, another hydrophobic mask 138, which defines the pixel areas, is printed to define areas where the active LED ink will reside after printing. The openings in the mask 138 expose the column conductors 136. The mask 138 is shown having beveled edges, which may be created by a blanket etching or by the printing process itself.

In FIG. 25, the active LED ink is printed, with the ink pooling in the openings in the mask 138. In the example, the openings in the mask 138 are slightly greater than the widths of the active LEDs 110, so the active LEDs 110 are all located directly over an associated column conductor 136. One or more active LEDs 110 may be printed within each of the openings.

The active LED ink is then cured to create an electrical connection between the bottom electrodes and the column conductors 136. A dielectric layer 140 is then printed over the active LEDs 110, followed by printing the control conductors 142, printing an additional dielectric layer 144, and printing top row conductors 146 to electrically contact the top electrodes. The active LEDs at any pixel location may be addressed by applying the appropriate voltage to the row and column conductors 146/136 and to the control conductors 142.

Since there is very little current conducted by the control conductors 142, the active LEDs may be turned on and off at a high speed. Therefore, addressing the active LEDs using the control conductors 142 may be beneficial.

Red phosphor areas 148 and green phosphor areas 150 are then printed over selected pixels to achieve the red, green, and blue sub-pixels previously discussed with respect to FIG. 22. If light is to be emitted from the opposite surface, the substrate 100, masks, and column conductors 136 can be transparent, and the phosphors are printed over the substrate 100.

The technique of FIGS. 23-25 allows the pixels to have a very small pitch since the locations of the active LEDs 110 are limited to narrow channels over the column conductors 136.

In another embodiment, the active LEDs 110 are not printed in pixel wells formed by a hydrophobic mask but are printed in pixel locations defined by the printing process, such as by using a masked screen, inkjet printing, or other selective printing technique.

In all embodiments, the entire display may be printed under atmospheric pressures in a roll-to-roll printing process on a flexible substrate. Thus, the display can be any size and inexpensive.

Although the orientations of the active LEDs 110 are generally controllable, such as 90% proper orientation, some percentage of the active LEDs 110 may not be oriented correctly or seated correctly in a pixel location. Any improperly orientated active LEDs will act as open circuits and will not affect the performance of the properly oriented active LEDs. This is illustrated in FIGS. 26A through 29B, where the drive transistors are assumed to be PMOS transistors. Each of FIGS. 26A through 29B represents two active LEDs 110 printed in a single pixel.

In FIGS. 26A, 27A, 28A, and 29A, the active LEDs 110 emit light when the gate control terminal is a threshold voltage below the positive voltage applied to the source terminal of the PMOS transistor and there is a sufficient voltage applied to the anode and cathode terminals of the active LEDs 110. Resistance Rlk1 represents the leakage between the gate control terminal and the positive voltage terminal. This leakage is beneficial since it provides a weak pull-up for the PMOS transistors, turning the transistors off (and the LEDs off) as a default, uncontrolled state. The leakage between the positive voltage terminal and the negative voltage terminal, represented as Rlk2, causes power loss and hence lowers power efficiency. However, Rlk2 is a high resistance. The leakage between the gate control terminal and the negative voltage terminal, represented as Rlk3, is a weak gate pull-down for the transistor and thus degrades the controllability of the LED. Rlk3, however, causes some tracking between the gate and source of the transistors so it is beneficial for turning off the LEDs. Issues of parasitic resistances should be taken into account in high density applications. Parasitic capacitances may also be taken into account.

Figure 26A:
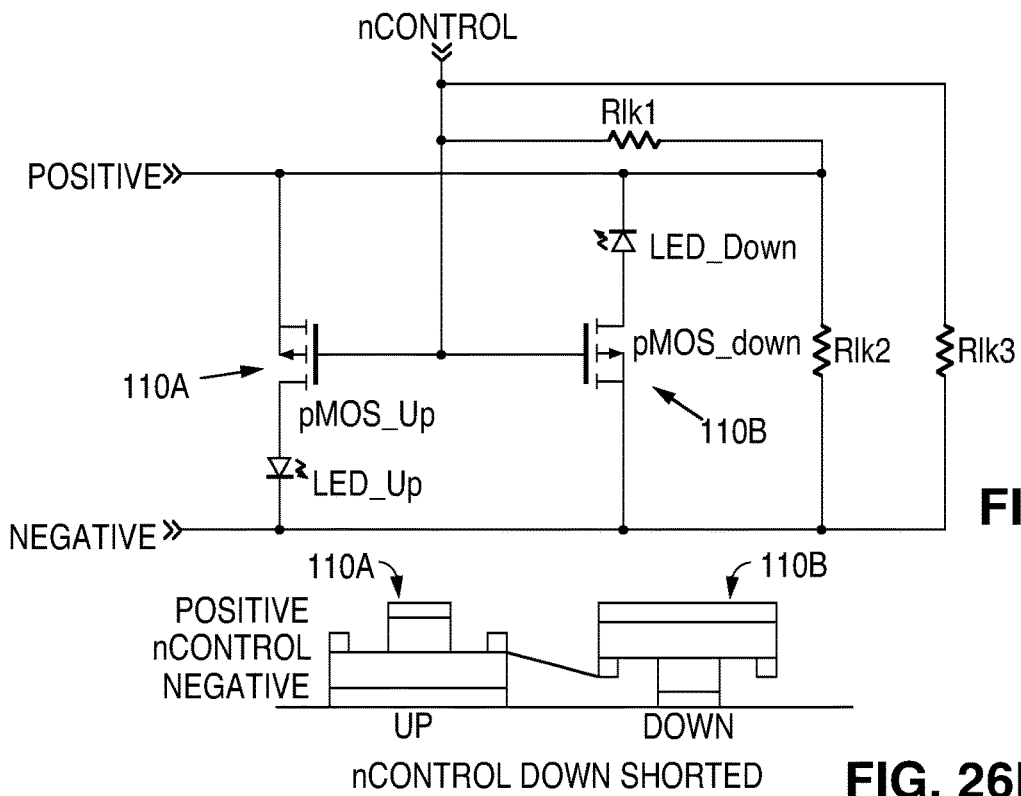
FIG. 26A schematically illustrates the circuit created by two active LEDs in a single pixel well having reverse orientations, where the middle control terminals are shorted.

FIG. 26A schematically illustrates the circuit created by two active LEDs 110A and 110B in a single pixel well having reverse orientations, where the middle control terminals are shorted. FIG. 26B illustrates the shorting of the control terminals of the active LEDs 110A and 110B of FIG. 26A. Since the upside down active LED 110B is reversed biased, it acts as an open circuit and does not affect the properly oriented active LED 110A.

Figure 27A:
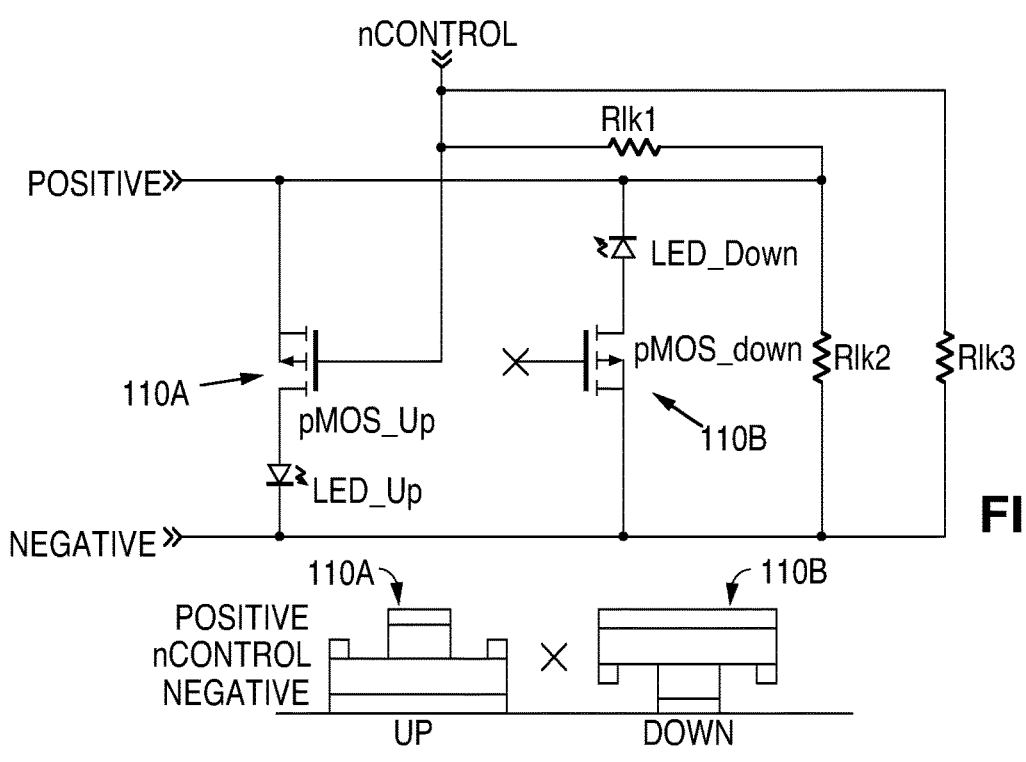
FIG. 27A schematically illustrates the circuit created by two active LEDs in a single pixel well having reverse orientations, where the middle control terminals are isolated from each other.

FIG. 27A schematically illustrates the circuit created by two active LEDs 110A and 110B in a single pixel well having reverse orientations, where the middle control terminals are isolated from each other. FIG. 27B illustrates the active LEDs 110A and 110B of FIG. 27A. Since the upside down active LED 110B is reversed biased and has no control voltage, it acts as an open circuit and does not affect the properly oriented active LED 110A.

FIG. 28A schematically illustrates the circuit created by two active LEDs 110A and 110B in a single pixel well having reverse orientations, where the middle control terminal of one active LED 110B is shorted to the positive terminal of the other active LED 110A. FIG. 28B illustrates the active LEDs 110A and 110B of FIG. 28A. Since the upside down active LED 110B is reversed biased and has an inverse polarity control voltage, it acts as an open circuit and does not affect the properly oriented active LED 110A.

FIG. 29A schematically illustrates the circuit created by two active LEDs 110A and 110B in a single pixel well having reverse orientations, where the middle control terminal of one active LED 110B is shorted to the negative terminal of the other active LED 110A. FIG. 29B illustrates the active LEDs 110A and 110B of FIG. 29A. Since the upside down active LED 110B is reversed biased, it acts as an open circuit and does not affect the properly oriented active LED 110A.

FIGS. 30-33 illustrate other configurations of integrated active LEDs which only have two terminals and are turned on by the proper polarity of a driving voltage to the terminals. Many other circuits may be formed depending on the desired function. The transistors provide an active means to reduce sensitivity to input voltage.

Figure 30:
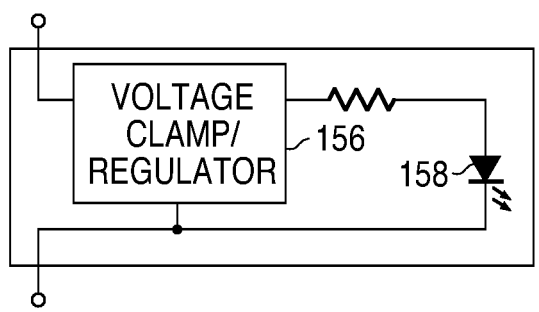
FIG. 30 illustrates a voltage clamp or regulator in series with an LED, which can be formed with the active LED along with an integrated resistor.
Figure 31:
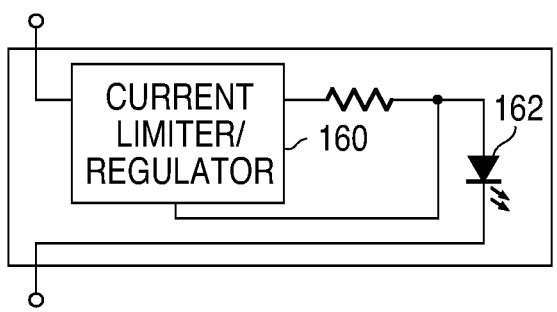
FIG. 31 illustrates a current limiter or regulator in series with an LED, which can be formed with the active LED along with an integrated resistor.
Figure 32:
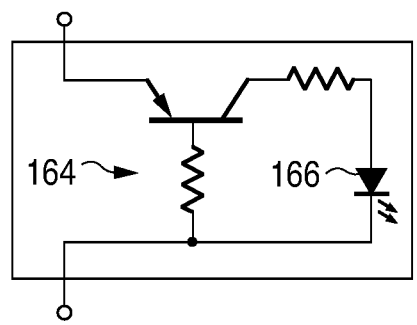
FIG. 32 illustrates a voltage clamp, which can be formed with the active LED and an integrated resistor.
Figure 33:
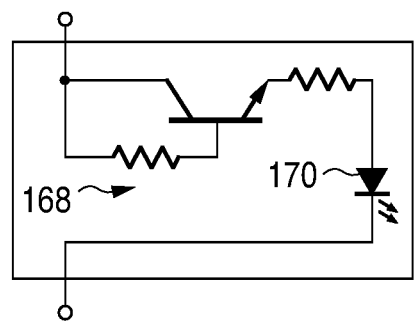
FIG. 33 illustrates a current limiter, which can be formed with the active LED and an integrated resistor.

FIG. 30 illustrates a voltage clamp or regulator 156, and resistor, coupled to an LED 158 in a single active LED. FIG. 31 illustrates a current regulator or limiter 160 coupled to the LED 162. FIG. 32 illustrates a voltage clamp 164, implemented using a pnp transistor, across the LED 166, and FIG. 33 illustrates a current limiter 168, implemented using an npn transistor, coupled to the LED 170. In both FIG. 32 and FIG. 33, the incorporation of resistors in the three-terminal structure with a transistor and an LED permits the fabrication of a wide variety of monolithic devices.

The preceding examples have used MOSFETs and bipolar transistors; however, the scope of this invention is not limited by the transistor technology. Realizations can be created using a CMOS, BiCMOS, BCD, or other integrated circuit processes. Additional transistor technologies could be used as well such as JFET, IGBT, Thyristor (SCR), Triac, and others.

In another embodiment, the transistor element is optional, and the printed devices are two-terminal vertical LEDs, such as singulated LEDs from the LED wafer of FIG. 2. Thus, there is no control terminal and control conductor. The LEDs in a pixel location are addressed by simultaneously supplying the correct polarity voltages to the row and column conductors connected to the top and bottom electrodes of the LEDs.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A display device comprising:
  a first hydrophobic mask formed over a substrate, the first hydrophobic mask having a plurality of first openings defining locations of a plurality of first conductor lines;
  the first conductor lines deposited in the first openings of the first hydrophobic mask for forming addressable lines;
  a second hydrophobic mask formed over the first hydrophobic mask, the second hydrophobic mask having a plurality of second openings defining a plurality of pixel locations;
  a plurality of microscopic light emitting diodes (LEDs) printed in the second openings of the second hydrophobic mask and over the first conductor lines, the LEDs having a bottom electrode making electrical contact to the first conductor lines, wherein the LEDs are printed as an LED ink such that at least one LED is located in each of the pixel locations;
  at least one first conductor formed to electrically contact top electrodes of the LEDs, such that all LEDs of a proper orientation within a single pixel location are connected in parallel; and
  at least one address circuit coupled to at least one of the first conductor lines and the at least one first conductor for applying a forward biasing voltage across all properly oriented LEDs within an addressed pixel location to emit light from the addressed pixel location.

2. The display device of claim 1, further comprising a plurality of different wavelength conversion materials formed over various ones of the pixel locations for generating different wavelengths of light from the pixel locations, wherein a variety of color components emitted by the pixel locations combine to create a range of colors, and
  wherein the plurality of LEDs emit blue light, and wherein the plurality of different wavelength conversion materials include red-emitting materials and green-emitting materials such that the pixel locations emit red, green, and blue light.

3. The display device of claim 1, wherein each of the LEDs is part of an active LED comprising a transistor integrated with the LED, wherein the active LED is a three-terminal device having an anode terminal, a cathode terminal, and a control terminal, and wherein the active LEDs are printed at the pixel locations.

4. The display device of claim 3, further comprising at least a first control conductor coupled to the control terminals of active LEDs within the pixel locations.

5. The display device of claim 4, wherein the at least one address circuit controls a voltage on the first control conductor to control a brightness of an addressed pixel location.

6. The display device of claim 1, wherein the first conductor lines form addressable row lines or column lines in the display device.

7. The display device of claim 1, wherein the at least one first conductor is one of a number of second conductor lines forming addressable row lines or column lines in the display device.

8. The display device of claim 1, wherein the second hydrophobic mask forms a 2-dimensional array of the second openings, and wherein the first conductor lines comprise parallel conductors exposed by the second openings.

9. The display device of claim 1, wherein the pixel locations form an ordered array of pixel locations, and the LEDs in the pixel locations are addressed using row and column conductors.

10. The display device of claim 1, wherein light from the LEDs exits a surface opposite to the substrate.

11. The display device of claim 1, wherein light from the LEDs exits through the substrate.

12. A method for forming a display device comprising:
    forming a first hydrophobic mask over a substrate, the first hydrophobic mask having a plurality of first openings defining locations of a plurality of first conductor lines;
    depositing the first conductor lines in the first openings of the first hydrophobic mask for forming addressable lines;
    forming a second hydrophobic mask over the first hydrophobic mask, the second hydrophobic mask having a plurality of second openings defining a plurality of pixel locations;
    printing a plurality of light emitting diodes (LEDs), as an LED ink, over the first conductor lines, the LEDs having a bottom electrode making electrical contact to the first conductor lines, the LED ink pooling within the pixel locations due to the second hydrophobic mask material preventing wetting by a solvent in the ink;
    curing the LED ink, such that at least one LED is located in each of the pixel locations;
    forming at least one first conductor to electrically contact top electrodes of the LEDs, such that all LEDs of a proper orientation within a single pixel location are connected in parallel; and
    providing at least one address circuit coupled to at least the first conductor lines for applying a forward biasing voltage across all properly oriented LEDs within an addressed pixel location to emit light from the addressed pixel location.

13. The method of claim 12, further comprising providing a plurality of different wavelength conversion materials over various ones of the pixel locations for generating different wavelengths of light from the pixel locations, wherein a variety of color components emitted by the pixel locations combine to create a range of colors, and
    wherein the plurality of LEDs emit blue light, and wherein the plurality of different wavelength conversion materials include red-emitting materials and green-emitting materials such that the pixel locations emit red, green, and blue light.

14. The method of claim 12, wherein each of the LEDs is part of an active LED comprising a transistor integrated with the LED, wherein the active LED is a three-terminal device having an anode terminal, a cathode terminal, and a control terminal, and wherein the active LEDs are printed at the pixel locations, the method further comprising forming at least a first control conductor to electrically contact the control terminals of the active LEDs within the pixel locations.

15. The method of claim 14, wherein the at least one address circuit controls a voltage on the first control conductor to control a brightness of an addressed pixel location.

16. The method of claim 12, wherein the first conductor lines form addressable row lines or column lines in the display device.

17. The method of claim 12, wherein the at least one first conductor is one of a number of second conductor lines forming addressable row lines or column lines in the display device.

18. The method of claim 12, wherein the pixel locations form an ordered array of pixel locations, and the LEDs in the pixel locations are addressed using row and column conductors.

19. The method of claim 12, wherein light from the LEDs exits a surface opposite to the substrate.

20. The method of claim 12, wherein light from the LEDs exits through the substrate.

* * * * *